United States Patent
Marr et al.

(10) Patent No.: US 9,385,798 B1
(45) Date of Patent: Jul. 5, 2016

(54) APPARATUS AND METHOD FOR EFFICIENT WAVEFORM PORTABILITY BETWEEN DIFFERENT PLATFORMS

(71) Applicant: RAYTHEON COMPANY, Waltham, MA (US)

(72) Inventors: Harry Marr, Manhattan Beach, CA (US); Ian S. Robinson, Redondo Beach, CA (US); Ray T. Hsu, Rancho Palos Verdes, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/606,701

(22) Filed: Jan. 27, 2015

(51) Int. Cl.
- H04L 27/00 (2006.01)
- H04B 7/06 (2006.01)
- H03K 19/177 (2006.01)

(52) U.S. Cl.
CPC ........ H04B 7/0613 (2013.01); H03K 19/17708 (2013.01)

(58) Field of Classification Search
CPC ......... G01R 33/3607; H04K 3/42; H04K 3/44
USPC .................................................. 375/260, 295
See application file for complete search history.

(56) References Cited

U.S. PATENT DOCUMENTS

| | | | |
|---|---|---|---|
| 5,436,600 A * | 7/1995 | Van Heteren | G01R 33/3607 324/314 |
| 6,028,548 A * | 2/2000 | Farmer | G01S 7/023 342/129 |
| 6,778,138 B2 * | 8/2004 | Purdy | H01Q 25/00 342/372 |
| 8,224,234 B1 | 7/2012 | Schuster et al. | |
| 2001/0015644 A1 * | 8/2001 | Schwilch | G01R 33/3607 324/307 |
| 2004/0263378 A1 * | 12/2004 | Jossef | G01S 7/022 342/20 |
| 2009/0135948 A1 * | 5/2009 | Kisovec | H04L 25/03834 375/295 |
| 2009/0289666 A1 * | 11/2009 | Kump | G06F 1/022 327/101 |
| 2010/0216407 A1 * | 8/2010 | Gormley | H04B 17/0015 455/67.11 |
| 2014/0362774 A1 | 12/2014 | Marr et al. | |
| 2015/0007158 A1 | 1/2015 | Marr et al. | |
| 2015/0188737 A1 * | 7/2015 | Xu | H04L 25/08 375/296 |

OTHER PUBLICATIONS

Invitation to Pay Additional Fees And, Where Applicable, Protest Fee for corresponding International Patent Application No. PCT/US2015/062797, filed Nov. 25, 2015, Invitation mailed Mar. 24, 2016 (5 pgs.).

* cited by examiner

*Primary Examiner* — Freshteh N Aghdam
(74) *Attorney, Agent, or Firm* — Lewis Roca Rothgerber Christie LLP

(57) ABSTRACT

Method and apparatus for generating channelized hardware-independent waveforms include: generating metadata associated with a waveform, the metadata including a frequency list, a phase list and amplitude information, wherein the metadata is generated independent of a number of channels; interpreting the metadata to generate channel select, frequency, phase and amplitude parameters; providing the frequency, phase and amplitude parameters to a direct digital synthesizer (DDS) to generate a digital signal; providing the channel select parameter to a channel selector to generate a plurality of channelized waveforms from the generated digital signal; and transmitting the plurality of channelized waveforms over a plurality of communication channels.

16 Claims, 6 Drawing Sheets

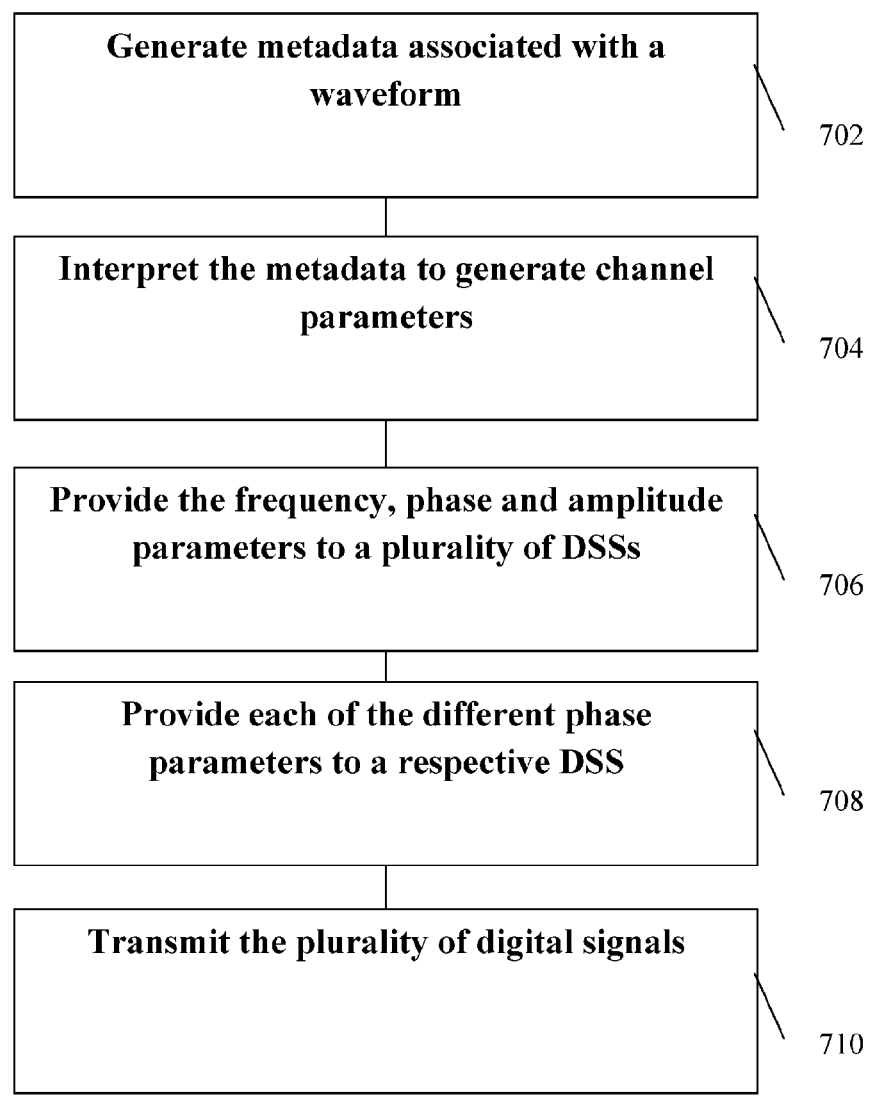

APPARATUS AND METHOD FOR EFFICIENT WAVEFORM PORTABILITY BETWEEN DIFFERENT PLATFORMS

FIELD OF THE INVENTION

This invention generally relates to electronic circuits and waveform generation techniques, and more specifically to an apparatus and method for efficient waveform portability between different platforms.

BACKGROUND

Digital wideband architectures are being increasingly utilized for high speed digital communications. Wideband generally refers to bandwidths from kilohertz to multi-gigahertz bandwidths. When the bandwidths of the signals being considered are larger than (e.g., a multiple of) the speed of the digital logic processing those signals, channelized architectures are used to accommodate the high bandwidth signals in a slower circuit. A direct digital synthesizer (DDS) is a type of frequency synthesizer that creates arbitrary waveforms from a fixed-frequency reference clock. A DDS uses a digitally deterministic frequency synthesis technique, which is based on a digital definition of the result to generate a signal, by using logic and memory to digitally construct the output signal, and a data conversion device to convert the signal from digital to analog domain. That is, the DDS method of constructing a signal uses digital principles, and the precise amplitude, frequency, and phase may be known and controlled.

Analog voltage controlled oscillators have been typically used to create waveforms, resulting in a limited frequency range. In digital architectures, the current practice involves direct digital synthesis where multiple parallel DDS circuits create I/Q at very high rates directly for bandwidths at speeds that are multiples of the digital logic. In other typical methods, each technique, defined as a waveform with a specific instantiation of frequency, phase, and amplitude parameters as a function of time, has to be aware of the channelized structure explicitly switch channels in the architecture or have a specific parameter selecting a channel. Each technique typically has a DDS associated with it and raw I/Q data are passed around data lanes.

Channelized radio receivers divide an incoming radio frequency signal into plural frequency-segregated segments for performing differing signal processing of the output signal in different channels, the physical separation of hardware relating to different channels, reduction of data rate per channel, and the preclusion of cross channel interference effects, among others. However, in such typical channelization techniques, a frequency and a channel must be calculated and specified for each signal, which adds complexity, particularly when summing signals together. Many attempts have been made at the wideband receive side of channelized architectures. There have also been architectures for the transmit side of narrow band radio waveforms, such as for communications. However, little work has been shown for wide band channelized transmit architectures.

Furthermore, waveforms (techniques) are often difficult to port between platforms due to platform dependent architectures. Usually a great deal of verification such as extensive testing on a simulator is necessary to verify the revised waveforms to be ported to a new platform. Most existing waveform generators are platform dependent and have to be modified to fit a certain channelization scheme or parallelization scheme.

Many attempts have been made to write portable. The main set of attempts has been targeted at writing C code or other general purpose code. However, the problem with C code (and most other coding languages) is that these languages are not portable to field programmable gate arrays (FPGAs) and other programmable logic devices and thus is not applicable to many of FPGA-based platforms.

These problems become aggregated and even more challenging in a wide band channelized architecture that needs to be portable to different platforms.

SUMMARY

In some embodiments, the present invention is a method and apparatus for creating waveforms (techniques) using a metadata approach for waveform design. In some embodiments, the present invention is a system including a metadata interpreter circuit that interprets the metadata and generates a waveform corresponding to the metadata. The metadata-based waveform can then be ported to another (different) platform with little modification.

In some embodiments, the present invention is a method for generating channelized hardware-independent waveforms. The method includes: generating metadata associated with a waveform, the metadata including a frequency list, a phase list and amplitude information, wherein the metadata is generated independent of a number of channels; interpreting the metadata to generate channel select, frequency, phase and amplitude parameters; providing the frequency, phase and amplitude parameters to a direct digital synthesizer (DDS) to generate a digital signal; providing the channel select parameter to a channel selector to generate a plurality of channelized waveforms from the generated digital signal; and transmitting the plurality of channelized waveforms over a plurality of communication channels.

In some embodiments, the present invention is an apparatus for generating channelized hardware-independent waveforms. The apparatus includes: a meta data generator circuit for generating metadata associated with a waveform, the metadata including a frequency list, a phase list and amplitude information, wherein the metadata is generated independent of a number of channels; a meta data interpreter circuit for interpreting the metadata to generate channel select, frequency, phase and amplitude parameters; a direct digital synthesizer (DDS) for inputting the frequency, phase and amplitude parameters to generate a digital signal; and a channel selector circuit for inputting the channel select parameters to generate a plurality of channelized waveforms from the generated digital signal and transmitting the plurality of channelized waveforms over a plurality of communication channels.

In some embodiments, the present invention is a method for generating parallelized hardware-independent waveforms. The method includes: generating metadata associated with a waveform, the metadata including a frequency list, a phase list and amplitude information, wherein the metadata is generated independent of a number of parallel waveform paths; interpreting the metadata to generate frequency and amplitude parameters, and a plurality of different phase parameters, each for a respective one of said parallel waveform paths; providing the frequency and amplitude parameters to a plurality of direct digital synthesizers (DDSs); providing said each of the plurality of different phase parameters to a respective DSS for generating a plurality of digital signals; and transmitting the plurality of digital signals over a plurality of communication channels.

In some embodiments, the present invention is an apparatus for generating parallelized hardware-independent waveforms. The apparatus includes: a meta data generator circuit for generating metadata associated with a waveform, the metadata including a frequency list, a phase list and amplitude information, wherein the metadata is generated independent of a number of parallel waveform paths; a meta data interpreter circuit for interpreting the metadata to generate frequency and amplitude parameters, and a plurality of different phase parameters, each for a respective one of said parallel waveform paths; a plurality of direct digital synthesizers (DDSs) for inputting the frequency and amplitude parameters; and a phase selector for providing each of the plurality of different phase parameters to a respective one of said plurality of DSS for generating a plurality of digital signals to be transmitted over a plurality of communication channels.

BRIEF DESCRIPTION OF THE DRAWINGS

FIG. 7 is an exemplary proves flow for a parallel portable waveform generation circuit, according to some embodiments of the present invention.

DETAILED DESCRIPTION

Figure 1:
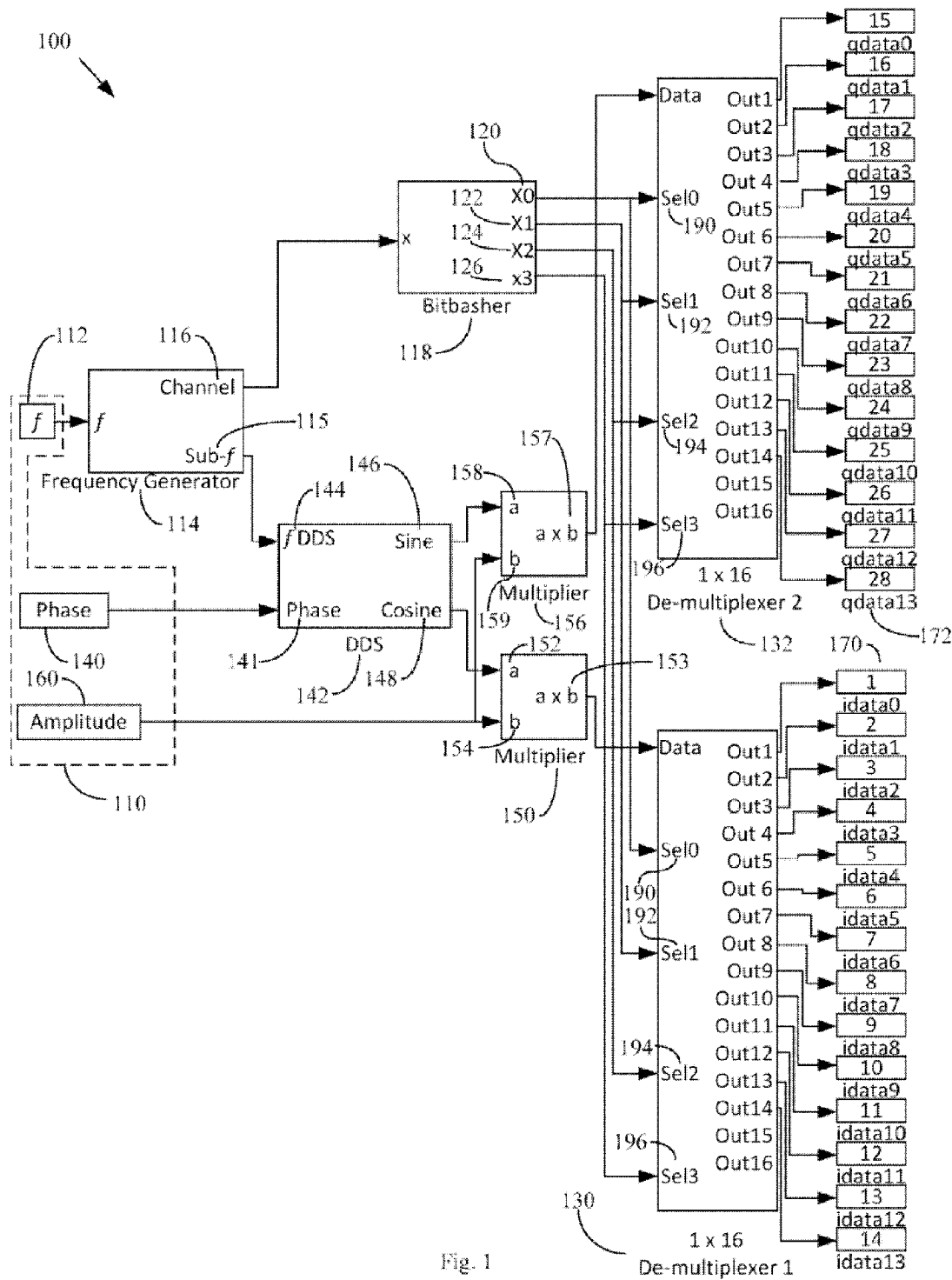
FIG. 1 illustrates a block diagram of a wide band inverse channelization device.

In some embodiments, the present invention comprises of an architecture, circuits and methodology for constructing waveforms, which are modular and can fit identically into wideband or narrowband, channelized, or parallel path type of architectures and thus are platform independent. The invention thus makes it possible for an identical waveform to be ported between a parallel and channelized architecture. The present invention is applicable to any waveform regardless of its complexity, for a given sample rate and bit depth, for example, a large number of complicated jamming waveforms that are updated on a clock-by-clock basis. The processes of the present invention may be implemented using FPGA, discrete or integrated circuits, firmware executed by specialized hardware or any combination of the above hardware/structures.

Each waveform generating technique creates a frequency list as a function of time. For a subset of waveform generating techniques, a phase list and amplitude list may also need to be constructed. According to some embodiments, any possible waveform or combination of waveforms can be constructed with these three lists. The technique does not need to be aware or make use of any channelized architecture and a technique does not need to generate its own I/Q thereby making multiple techniques cheap and efficient to have in the same architecture. A wideband direct digital synthesizer (DDS) channelizer circuit interprets the frequency function list to create baseband I/Q and select the correct channel as a function of time. Multiple "frequency function lists" can be multiplexed together to allow multiple simultaneous techniques, technique commutation, etc.

Currently in electronic warfare (EW) and similar applications, digital architectures are used to create extremely wideband RF waveforms (100 s MHz-several GHz). FPGAs and other digital implementations run fast enough to provide narrowband jamming techniques (up to several 100 MHz) using a direct, single channel, baseband approach. However, to enable wideband techniques where the bandwidth is greater than the data rate of digital logic, a channelizer approach passes a baseband signal through any one of a number of channels.

DDS-based circuits greatly simplify the transmit architecture for the rest of the transmit chain. A wide band channel translation circuit receives a list of wide band frequencies at which to transmit. This wideband frequency list is then translated into a given channel and the frequency used at that specific channel. The circuits also determine phase modulation and amplitude modulation as well as time commutation. This information is fed to a DDS circuit and finally through a channel de-multiplexor to output the proper waveform, e.g., baseband digital I/Q signals, as a function of time to an inverse channelizer to be transmitted across a plurality of communication channels. The transmitted waveforms is then converted to a wideband digital waveform and then converted to a wide analog waveform by a digital to analog converter, if need. This allows an entire architecture such that new jamming techniques need only create a parameter, e.g., frequency list, regardless of the channelized architecture being used. Thus, even if the specific channelizer block changes, e.g., the hardware is upgraded to higher speeds, the techniques stay valid, and only the channel select circuit is updated.

The wideband channel translation circuit translates a frequency list, and amplitude and phase commands into proper channel select and intra-channel DDS commands. The channel de-multiplexor circuit and the intra-channel amplitude and phase amplitude circuits are used to create novel implementations from any known jamming techniques including Chirp, DRPM, RPM, Random Slope Generation (RSG), Wideband Noise, Subcarriers, and others.

FIG. 1 illustrates a block diagram of a typical wide band inverse channelization device 100. Input metadata 110 is a list of discrete parameters as a function of time defining a waveform's frequency, phase, and amplitude. These parameters may change as often as every digital time step (clock cycle) but only if a change in the parameter value occurs. Frequency data 112 is provided to a frequency generator 114. A bit basher 118 receives channel selection data 116 and performs slicing, manipulation, concatenation and augmentation of inputs to create selection outputs 120, 122, 124, and 126. The operation to be performed by the bit basher 118 may be implemented using software tool, such as Verilog™. The bit basher 118 provides the selection outputs 120, 122, 124, 126 at defined ports, wherein the number of ports is equal to the number of expressions. In FIG. 1, the bit basher 118 provides the outputs 120, 122, 124, 126 as input to a first de-multiplexers 130 and a second de-multiplexers 132 as 4 select bits 190, 192, 194, 196.

Phase data 140 is provided to a phase input 141 of the DDS 142. Sub-frequency data 115 is provided to the DDS 142 at the frequency DDS input 144. The DDS 142 provides baseband digital I/Q signals as a sine wave 146 and a cosine wave 148. The sine wave 146 is provided to a first input 158 of a second multiplier 156. The cosine wave 148 is provided at a first input 152 of the first multiplier. Amplitude data 160 is provided to the second input 154 of the first multiplier 150 and the second input 159 of the second multiplier 156. The first multiplier 150 and the second multiplier 156 provide outputs 153, 157 to a data input 190 of the first multiplexer 130 and the second de-multiplexer 132, respectively.

Input data metadata 110, i.e., the frequency 112, phase 140 and amplitude 160, are generated and manipulated by in the same format regardless of the number of channels. Through operation of the frequency generator 114 and the DDS 142, the input metadata 110 are transformed into dynamic I/Q data at the output 170 of the first de-multiplexer 130 and at the output 172 of the second multiplexer 132. Thus, a point is used to provide input metadata 110 instead of each technique sending its own raw data. The input metadata 110 scales to N number of channels creating an arbitrarily wide instantaneous bandwidth.

Figure 2:
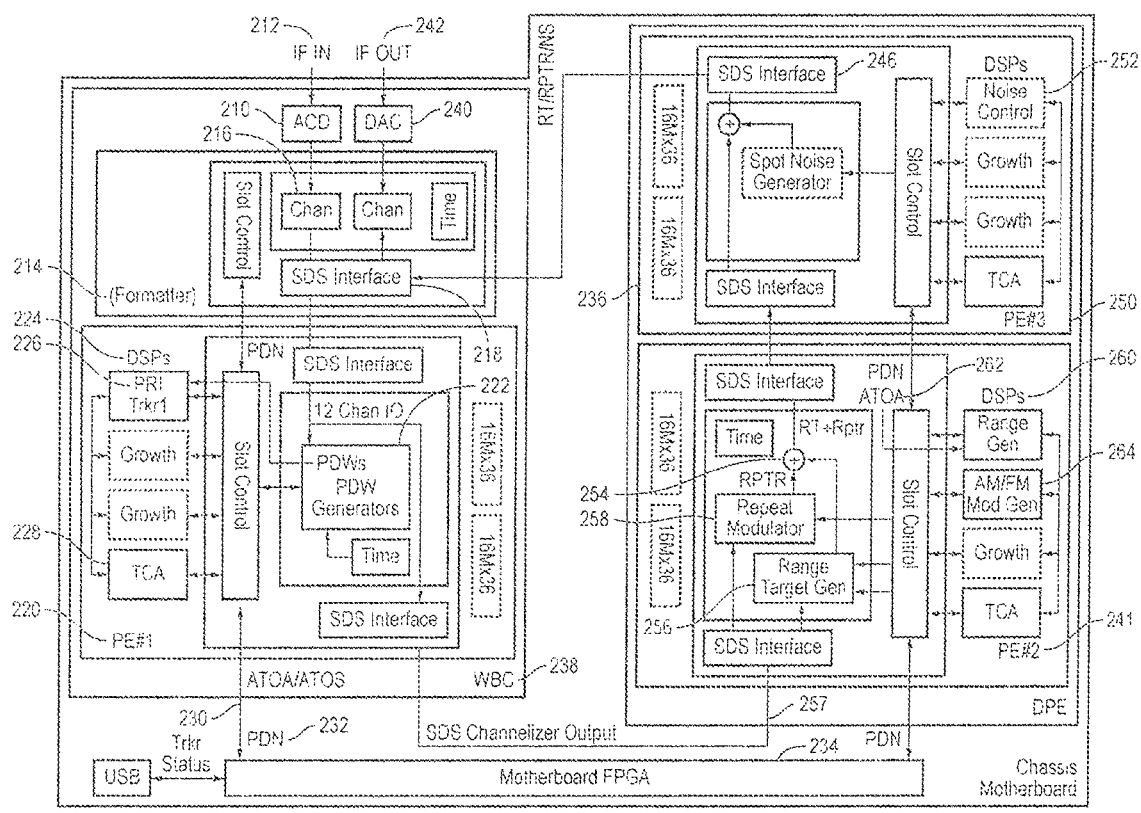
FIG. 2 illustrates a block diagram of a waveform/technique generator that uses raw I/Q data, according to some embodiments of the present invention.

FIG. 2 illustrates a block diagram of a technique generator 200 that uses raw I/Q data, according to some embodiments of the present invention. As depicted, raw I/Q data are sent around the daisy-chain of a plurality of FPGAs to be modified within each FPGA. The data is sent in its final form and sent out of the channelizer. More specifically, an ADC 210 samples input IF 212 from REX converters (not shown). Formatter FPGA 214 provides a channelizer 216 to channelize ADC data into I/Q channels. A smart distribution system (SDS) 218 transports the middle channels to PE#1 220. At PE#1 220, PDW generators 222 detect signal energy and extract signal ToA, amplitude, pulse width, frequency, POP and apply transmit tags. The PDWs are transported to DSP 224 for parameter extraction. The DSP 224 extracts the PRI 226. The tracker DSP 228 sends ATOA/ATOS predictions 230 to RTG via PDN 232. The tracker DSP 228 sends periodic status report to Host PC 234.

A digital-to-analog converter (DAC) 240 outputs IF energy 242 to the REX up-converters (not shown). The formatter FPGA 214 pads channel input to channels, then an inverse channelizer 244 separates the channels of the I/Q streams into a DAC. A SDS 246 transports RTG, repeater and noise I/Q data to the formatter FPGA 214 in WBC 238. SDS 248 delivers RTG and repeater I/Q data to the noise PE#3 250 where it is summed with noise technique waveforms by noise control DSP 252.

A combiner 254 in PE#2 241 sums the RTG 256 with repeat modulator 258 and the RTG DSP 260 uses ATOA and ATOS updates 262 to update the target offset commands. The AM/FM DSP 264 updates target modulation rates and applies the modulations to each target. Thus, in FIG. 2, raw I/Q data is sent around the daisy-chain of FPGAs. Moreover, the raw I/Q data is modified within each of the FPGAs, i.e., 220, 241, 250.

Figure 3:
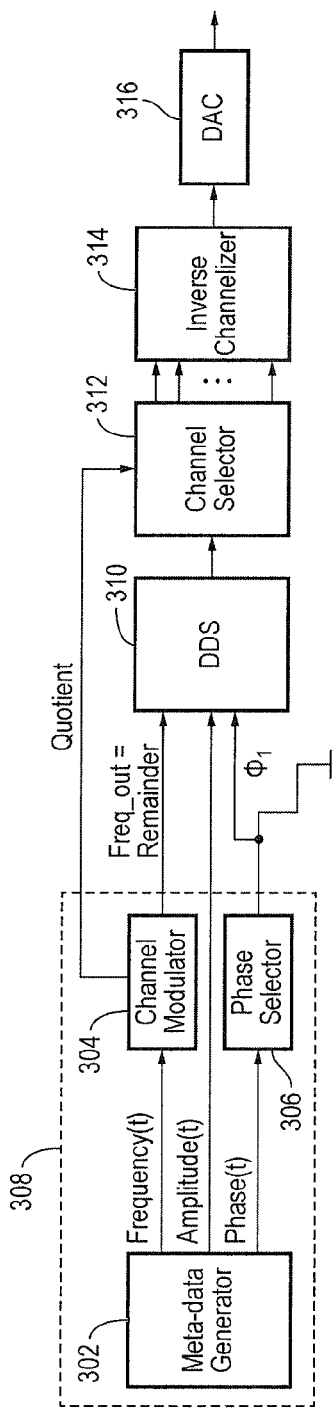
FIG. 3 is an exemplary block diagram of a channelized portable waveform generation circuit, according to some embodiments of the present invention.

FIG. 3 is an exemplary block diagram of a channelized portable waveform generation circuit, according to some embodiments of the present invention. As shown, a technique/waveform generator 302 generate a waveform including metadata that is portable across different channelized hardware platforms. The metadata is a list of discrete waveform parameters defining the waveform's, for example, frequency, phase, and amplitude. The metadata is generated and manipulated in the same format regardless of the number of channels in the system so as to make the generated waveform portable across different hardware platforms. Examples of frequency, phase, and amplitude metadata and circuits to generate them are provided in detail in a co-owned U.S. patent application Ser. No. 13/910,731, and entitled "Circuits And Method To Enable Efficient Generation Of Direct Digital Synthesizer Based Waveforms Of Arbitrary Bandwidth," the entire contents of which is hereby expressly incorporated by reference.

The waveform generator 302 includes a metadata generator that generates the metadata. For example, assuming a waveform is desired that may alternate between two output frequencies (Fout) every time step, such as 105 MHz and 1107 MHz. Then, a metadata generator circuit would output a digital value on alternating time steps representing 105, 1107, 105, 1107 and so on, assuming the frequency list was being interpreted in units of MHz. However, due to clocking speed limits of modern digital devices, such as FPGAs or a DDS on a modern FPGA, they can only accept frequency values with a sampling rate in the 100s of MHz, 200 MHz for example, and thus waveforms are generated with output frequencies at half the sampling rate (the Nyquist rate), up to 100 MHz in this example. Accordingly, this frequency metadata thus need to be translated into a frequency range usable by a digital DDS.

In some embodiments, the frequency metadata is divided by the channel width (channel bandwidth) via, for example, by a frequency divider in a frequency modulator circuit 304. The frequency metadata (parameters) are then interpreted by the modulator circuit 304. The modulator circuit 304 modulates the frequency metadata by performing a digital divide to create a quotient and a remainder, which are then used as a channel selector and DDS frequency, respectively.

For example, in a channelized architecture, to achieve 1107 MHz (if we assume each channel is 100 MHz wide for instance), the 1107 MHz metadata parameter is divided by 100 MHz. The remainder of 7 MHz is the frequency input parameter to the DDS and the quotient of 11 is used to route the DDS output to the $12^{th}$ channel (assuming the first channel is channel 0) representing 1100-1200 MHz such that the output of the inverse channelizer would ultimately be 1107 MHz.

A primary usefulness of this concept of frequency metadata is that it allows a circuit to be built or firmware to be programmed to construct a technique such that the technique need not be updated with a change in architecture and thus the design can be agnostic to how the desired frequency list is interpreted and generated such as by a channelizer or generating samples in parallel. Without this metadata frequency list, a designer programming an FPGA to achieve the frequency output of 105 MHz, 1107 MHz, 105 MHz, 1107 MHz, etc., would have to be aware of the specific type of architecture being used, such as if the architecture is channelized, how wide each channel is, what the FPGA clock rate is, how many channels are present, and take each of these parameters into account when generating the frequency list output. In this example, the designer without the benefit of using the frequency metadata would have to explicitly specify 5 MHz in channel 2, 7 MHz in channel 12, 5 MHz and channel 2, 7 MHz and channel 12, and so on. This way, both a DDS and a channel number need be specified. If the channel widths were changed to 120 MHz, for example, to achieve the same frequency output of 105 MHz, 1107 MHz, 105 MHz, 1107 MHz, etc. out of the inverse channelizer, the designer would have to update the design to specify 105 MHz in channel 1, 27 MHz in channel 10, etc.

Similarly, the phase metadata (parameters) are interpreted by a phase selector circuit 306, which selects a single phase value for all the channels. In some embodiments, all the outputs of the phase selector circuit 306, except one output are grounded. Accordingly, the metadata parameters are sent out to DDS(s), instead of the typical case, in which I/Q data is sent.

The output of the frequency modulator circuit 304, along with the phase value and amplitude metadata are input to a DDS 310. The quotient of the frequency division is input to a channel selector 312 to select the appropriate channel. In some embodiments, the channel selector is implemented as a de-multiplexor and the quotient is used as the select input to the de-multiplexor to specify which output channel is asserted out of the channel selector. The quotient and remainder are computed via a divider block with the channel width parameter that is input to and used by an inverse channelizer 314 as follows:

Quotient(*F*out/channel_width)=channel number to be selected

Remainder(*F*out/channel_width)=input frequency to DDS

For a different channelizer (i.e., a different hardware platform), only the channel_width parameter needs to change, not the waveform itself.

The DDS 310 creates the I/Q data for the intended waveform at the data rate of a single channel. The output of the DDS is inputted to the channel selector 312. The waveform generator 302 and the DDS 310 transform the input metadata into a dynamic digital signal at the output of the channel selector 312 to be transmitted over one or more channels to an inverse channelizer 312. In some embodiments, the output of the DDS is baseband I/Q data. The channel selector passes the baseband I/Q through to the appropriate channel of the inverse channelizer. In these embodiments, the inverse channelizer has the property that it converts baseband I/Q in a given channel up to a RF frequency. For example, if each channel is 100 MHz wide, any data in channel 0 is converted to the band 0-100 MHz, and signal in channel 2 is converted to the band 100-200 MHz, etc.

In some embodiments, multiple signals may be generated simultaneously by multiple DDSs and routed simultaneously through multiple channel selectors and multiple baseband I/Q signals routed to a given channel would be added together before insertion into the inverse channelizer 314. In some embodiments, multiple baseband I/Q signals are routed to different channels of the inverse channelizer simultaneously. In some embodiments, a signal may be routed from one channel in one time instant and switched to be routed to a different channel the on the next clock cycle. These properties of the inverse channelizer allow wide band widths to be achieved. The output of the channel selector 312 can be transmitted (for example, over a wired or wireless network) to the inverse channelizer 314. The output of the inverse channelizer is output into an DAC 316.

The phase and amplitude metadata lists are sent synchronously with the frequency metadata (Fout) such that phase, amplitude, and frequency values are given as a set. In some embodiments, the phase, amplitude, and frequency metadata are not resent for every clock cycle, rather, they are sent only during an event change, such as when the desired frequency changes. For example, only a single value for frequency would be sent to create a continuous wave (CW) tone at the IF value of the CW tone (Fout).

Figure 4:
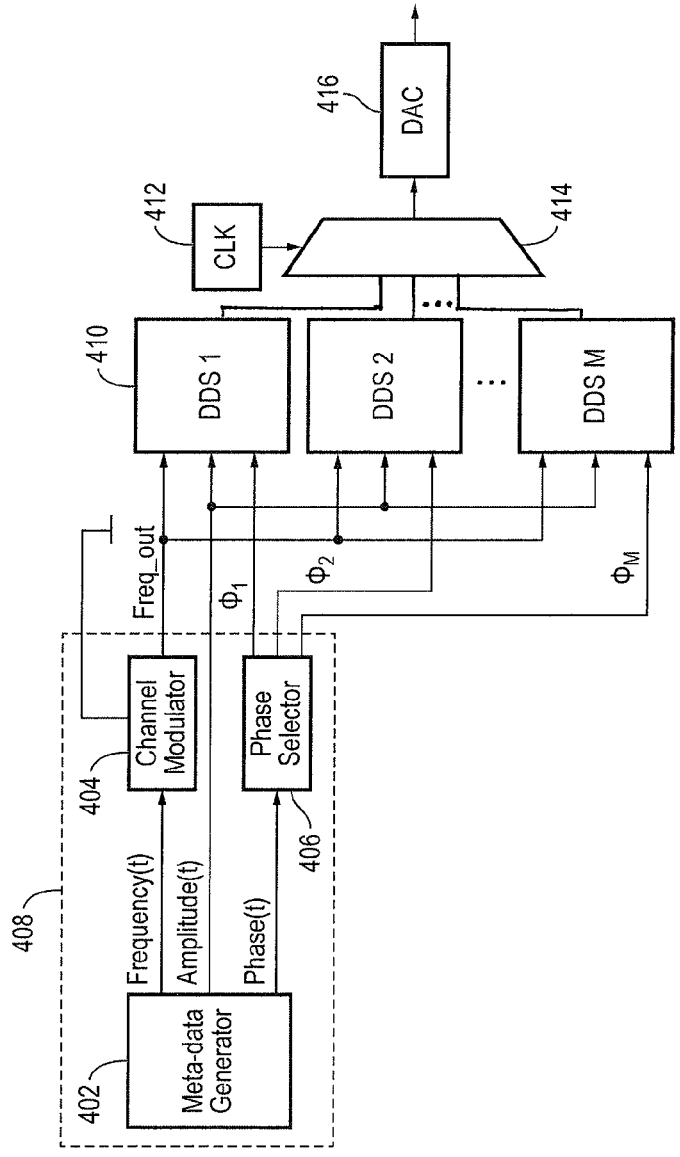
FIG. 4 is an exemplary block diagram of a parallel portable waveform generation circuit, according to some embodiments of the present invention.

FIG. 4 is an exemplary block diagram of a parallel portable waveform generation circuit, according to some embodiments of the present invention. As illustrated, a technique/waveform generator 402 generate a waveform with metadata to make the generated waveform portable across different channelized hardware platforms. The waveform generator 402, similar to the waveform generator 302 in FIG. 3, includes a metadata generator. In some embodiments, the two metadata generator circuits (302 and 402) see the same interface in both the channelized and parallel DDS architectures, allowing the metadata generator circuit to be ported across platforms without alteration. The frequency metadata is then divided by the number of parallel DDS paths via, for example, a frequency divider in the frequency modulator circuit 404. The modulator circuit 404 modulates the frequency metadata by performing a digital divide to create a quotient and a remainder. In this (parallel channel) case, the modulator circuit 404 outputs the quotient to each of the M DDSs 410 to be used as a DDS frequency. However, the remainder output is not used and may be grounded in some embodiments.

The phase metadata (parameters) are interpreted by a phase selector circuit 406, which selects a unique phase value for each of the M DDSs 410. That is, the phase selector circuit 404 interprets metadata information to create the appropriate phase response for each of the parallel channels. Accordingly, the metadata parameter outputs are fanned out to M DDSs, instead of the channelized case in which the data is only sent to a single DDS. For example, for a parallel architecture with M DDSs, the total sampling frequency of the system, Fs, is calculated as M*Fdds where Fdds is the clock rate of each DDS in the system. The frequency input parameter to each DDS for a desired output frequency, Fout, is then Fout/M. For example if 400 MHz output frequency is desired and 4 DDS are present, 400/4=100 MHz would be input to each DDS as the frequency. In some embodiments, a DDS accepts a phase increment parameter instead of a frequency and in this case the channel modulator block makes this translation. A DDS is often implemented as a table of 1000 different phase values of a sine wave for example. If the clock speed of the DDS (Fdds) is 200 MHz, a phase increment value of 1 would mean it would take 1024 output samples to create one period of a sine wave. Since each output sample is output every 5 ns with a 200 MHz clock in this case, it would take 5000 ns or 5 us to output one full period of the sine wave and thus with a phase increment value of 1, the output frequency would be 200 kHz. If the phase increment value were the maximum 500 (half of the table size), a period would take two output samples, for a total of 10 ns, for a period equaling 100 MHz output frequency.

Thus the frequency parameter input to a DDS (Fin) is related to the phase_increment and the "sine_table_size" parameters. The sine_table_size is the size of a lookup table that contains the phase and amplitude values of a sine wave such that entry 1 of the sine table is the first point in the sine wave, entry 2 is the second point and so on. Accordingly, a sine wave can be played out be reading out the entries in the sine table in order. Since the entries are read out at a given sampling rate, the period of the sine wave being read out is equal to the "sampling period" times the "number of samples read out" to get through one period (all the way through the table) of the sine wave.

For example, if the table values are read out at a 5 ns rate, a typical table size of 1024 entries is used, and the phase_increment is set to 1 such that all 1024 entries are ready out in order, the period of the resulting sine wave is 5 ns*1024=5.120 us. As the phase increment value is increased to 2, this means the entry to be read out of the sine table is incremented by 2 such that the first value is read out, then the third, then the fifth, etc. This mathematical relationship between Fin, the phase_increment, and the sine_table_size is illustrated as follows:

$$F\text{in}=phase\_increment/sine\_table\_size * Fdds \quad (1)$$

The phase offset angle (POA) in degrees is calculated by the phase selector circuit 406 for each of the M parallel DDS as follows POA for DDS1=1*Fout/Fs POA for DDS2=2*Fout/Fs

...

POA for DDS(M−1)=(M−1)*Fout/Fs    (2), where Fout is the desired output frequency given by the metadata generator and Fs is again equal to M*Fdds, or the total sampling rate the system is capable of when taking all M parallel DDS into account. Fclk 412 is equal to Fs, that is, the maximum rate at which a sample can be output to the DAC and is the same as the sampling frequency of the DAC. Fclk 412 is used to multiplex a sample from each of the M parallel DDS to the DAC, this is called a super sample rate system. For example, while each DDS might be outputting a sample at a 200 MHz rate, Fclk may run at 800 MHz in the case where there are 4 parallel DDS (M=4), such that a sample is input to the DAC at an 800 MHz rate. This allows the effective sampling rate of the system to be 800 MHz even though the sampling rate of each individual DDS is only 200 MHz in this example.

As a result, each DDS receives a unique phase such that when the samples from each of the M DDSs are multiplexed in order, the output stream creates a single waveform that has a frequency M times higher than each individual DDS is outputting. For example with 4 DDSs to output a sine wave, the phase values might be 0 degrees, 90 degrees, 180 degrees, and 270 degrees respectively from the 4 DDSs such that when the samples from the DDS are combined to create a single waveform via the multiplexor 414 the combined waveform has samples with phases of 0, 90, 180, 270, 0, 90, 180, 270, etc. such that it rotates through the entire 360 degree phase circle of a waveform. The multiplexor 414 has the effect of serializing the data and provides a single data stream to the DAC, 416. For example, the multiplexor 414 would output the data from DDS 1 on clock cycle 1, DDS 2 on cycle 2, DDS 3 on cycle 3, DDS 4 on cycle 4, DDS 1 on cycle 5, etc.

Each appropriate phase response is input to a corresponding DDS 410 (1 to M), along with the metadata frequency and amplitude information to transform the input metadata and phase responses into a digital signal at the output of each of the DDSs 410.

In some embodiments, the waveform generator 402 includes a metadata generator described in more detail below with respect to FIG. 5. The frequency metadata is then divided by the channel width (number of channels) via, for example, a frequency divider (not shown), in a frequency modulator circuit 304

Figure 5:
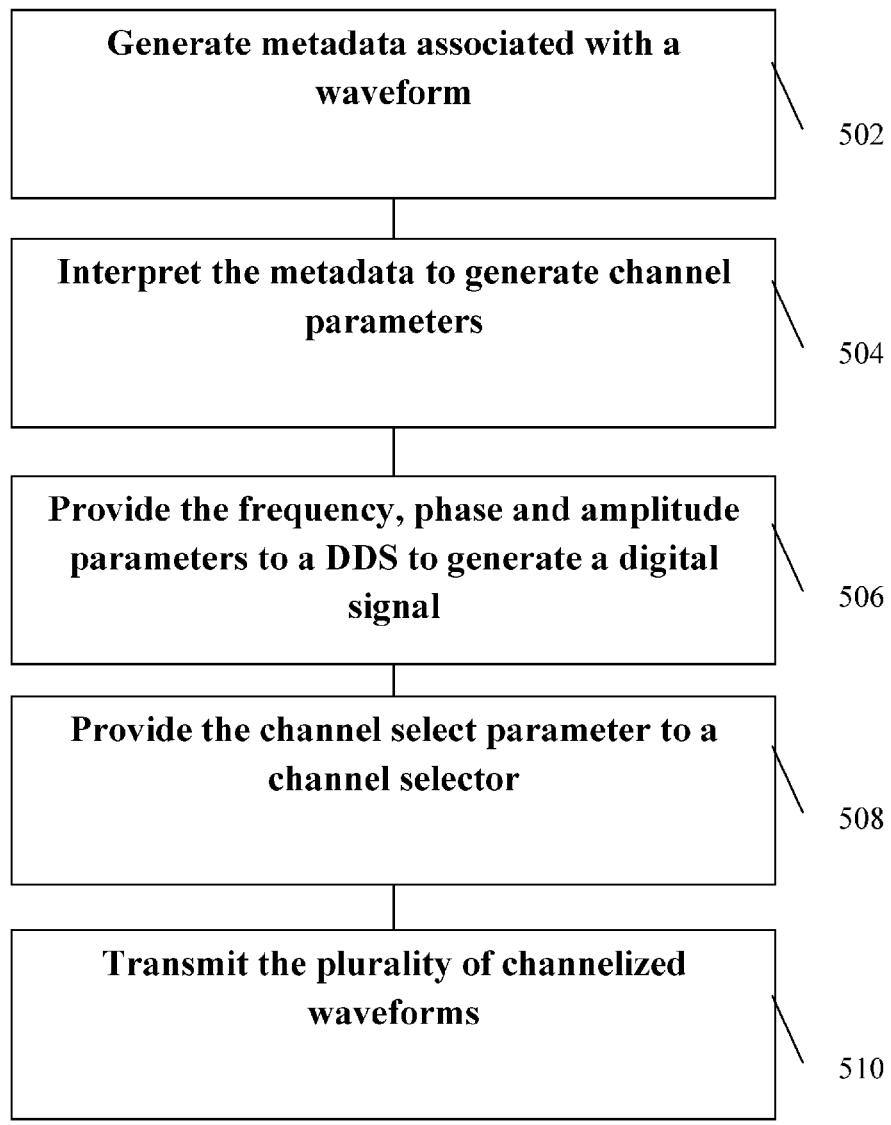
FIG. 5 is an exemplary process flow for a channelized portable waveform generation circuit, according to some embodiments of the present invention.

FIG. 5 is an exemplary process flow for a channelized portable waveform generation circuit, according to some embodiments of the present invention. As shown in block 502, metadata associated with a waveform is generated, as described above with respect to FIG. 3. The metadata includes a frequency list, a phase list and amplitude information, and is generated independent of a number of channels in the channelized system. In block 504, the metadata is interpreted to generate channel select, frequency, phase and amplitude parameters. In some embodiments, interpreting the metal data may include dividing the frequency list by the number of channels to generate a quotient to be provided to the channel selector and a remainder to be provided to said DDS, and selecting a single phase for all the channels to be provided to said DDS.

The frequency, phase and amplitude parameters are then provided to a DDS to generate a digital signal, in block 506. The channel select parameter is provided to a channel selector to generate a plurality of channelized waveforms from the generated digital signal, in block 508. The channelized waveforms can then be transmitted over the communication channels, in block 510. In some embodiments, the transmitted plurality of channelized waveforms may be inverse channelized to generate a digital signal and the digital signal then converted to an analog signal.

In some embodiments, metadata associated with a plurality of different waveforms may be generated. The metadata for each of the plurality of different waveforms are then multiplexed to generate a plurality of different digital signals to be transmitted over said plurality of channels. This way, multiple waveforms can be generated and each of them channelized and transmitted over the same multiple channels.

Figure 6:
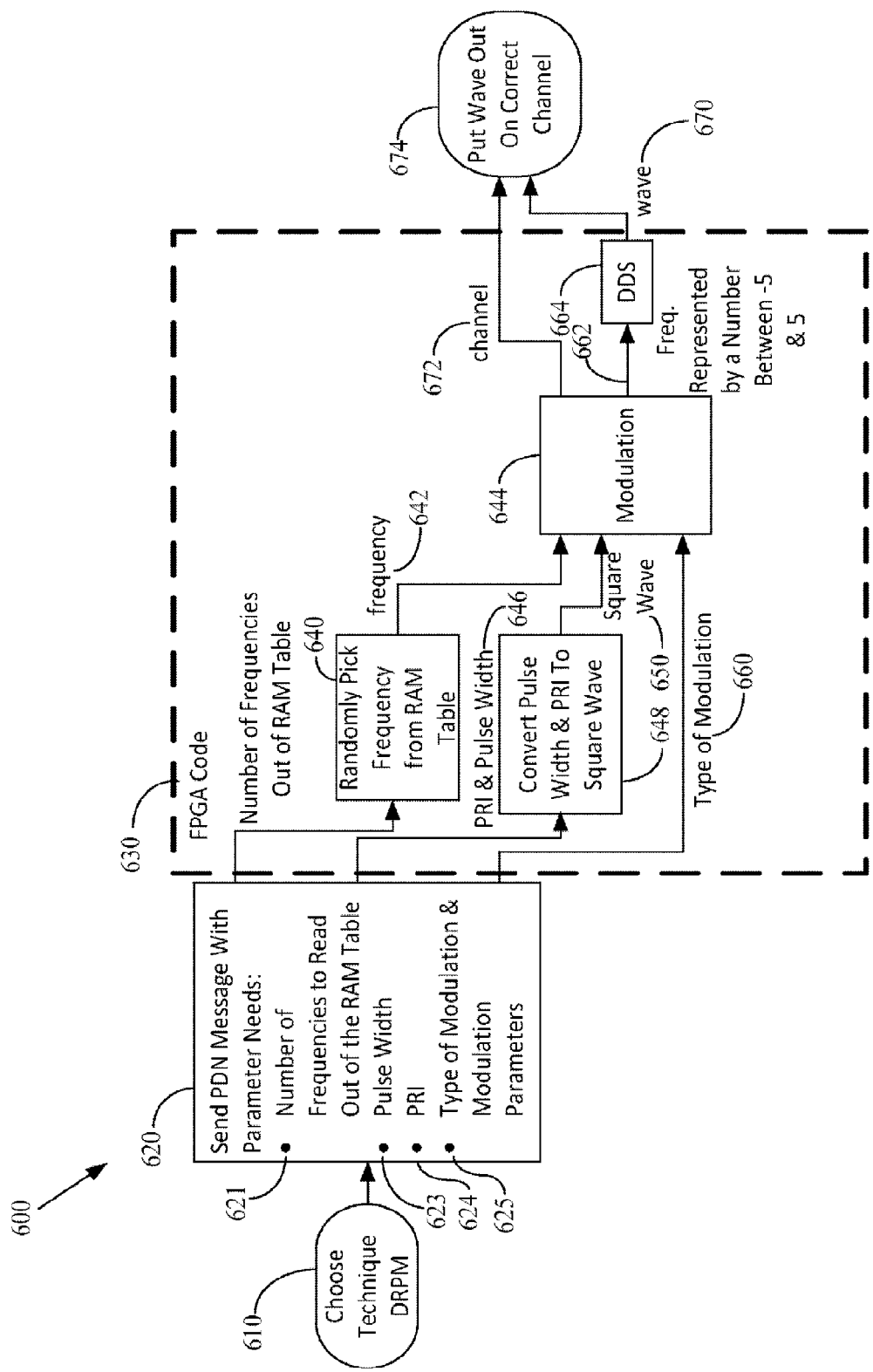
FIG. 6 illustrates a modular architecture for swapping in new waveforms according to some embodiments of the present invention.

FIG. 6 illustrates a modular architecture for swapping the metadata generator 610 with a new one according to some embodiments of the present invention. As shown, user defined technique (waveform) files 610 are provided to a waveform architecture 620 for compiling to hardware. Models 630 that are created by the user may be used to generate user waveforms, e.g., user waveforms. Parameters are provided to the waveforms from a control processor or from memory from a register file 640 are also provided to the waveform architecture 620 for generating different types of waveforms from a single waveform block. The waveforms are multiplexed at a time multiplexer 650. The multiplexed waveforms 652 are provided as input to DDS 660. The DDS 660 proves output signals to an inverse channelizer 670, which are then provided to DAC 680.

FIG. 7 is an exemplary proves flow for a parallel portable waveform generation circuit, according to some embodiments of the present invention. As shown in block 702, metadata associated with a waveform is generated, as described above with respect to FIG. 3. The metadata includes a frequency list, a phase list and amplitude information, and is generated independent of a number of parallel waveform paths. In block 704, the metadata is interpreted to generate frequency and amplitude parameters, and a plurality of different phase parameters, each for a respective one of the waveform paths. The frequency and amplitude parameters are then provided to a plurality of DDSs, in block 706. Also, each of the different phase parameters is provided to a respective DSS for generating a plurality of digital signals, in block 708. The plurality of digital signals are then transmitted over several communication channels. The transmitted digital signals may then be multiplexed to generate a digital signal and then converted to an analog signal.

In some embodiments, metadata associated with a plurality of different waveforms may be generated and then multiplexed to generate a plurality of different digital signals to be transmitted over said plurality of parallel channels. This way, multiple waveforms can be generated and each of them transmitted over the same multiple parallel channels.

It will be recognized by those skilled in the art that various modifications may be made to the illustrated and other embodiments of the invention described above, without departing from the broad inventive step thereof. It will be understood therefore that the invention is not limited to the particular embodiments or arrangements disclosed, but is rather intended to cover any changes, adaptations or modifications which are within the scope of the invention as defined by the appended claims.

What is claimed is:

1. A method for generating channelized hardware-independent waveforms, the method comprising:
  generating metadata associated with a waveform, the metadata including a frequency list, a phase list and amplitude information for the waveform, wherein the metadata is generated independent of a number of communication channels;
  interpreting the metadata to generate channel select, frequency, phase and amplitude parameters for the waveform;
  providing the frequency, phase and amplitude parameters to a direct digital synthesizer (DDS) to generate a digital signal;
  providing the channel select parameter to a channel selector to generate a plurality of channelized waveforms from the generated digital signal; and
  transmitting the plurality of channelized waveforms over a plurality of communication channels.

2. The method of claim 1, further comprising inverse channelizing the transmitted plurality of channelized waveforms to generate a digital signal and converting the digital signal to an analog signal.

3. The method of claim 1, wherein said interpreting the metal data further comprises:
  dividing the frequency list by the number of communications channels to generate a quotient to be provided to the channel selector and a remainder to be provided to said DDS; and
  selecting a single phase for all the communication channels to be provided to said DDS.

4. The method of claim 1, further comprising:
  generating metadata associated with a plurality of different waveforms;
  multiplexing the metadata for each of the plurality of different waveforms; and
  generating a plurality of different digital signals to be transmitted over said plurality of communication channels.

5. The method of claim 1, further comprising modifying only the number of communication channels for porting the waveform generation to a different platform having a different number of communication channels.

6. An apparatus for generating channelized hardware-independent waveforms comprising:
  a meta data generator circuit for generating metadata associated with a waveform, the metadata including a frequency list, a phase list and amplitude information for the waveform, wherein the metadata is generated independent of a number of communication channels;
  a meta data interpreter circuit for interpreting the metadata to generate channel select, frequency, phase and amplitude parameters for the waveform;
  a direct digital synthesizer (DDS) for inputting the frequency, phase and amplitude parameters to generate a digital signal; and
  a channel selector circuit for inputting the channel select parameters to generate a plurality of channelized waveforms from the generated digital signal and transmitting the plurality of channelized waveforms over a plurality of communication channels.

7. The apparatus of claim 6, further comprising an inverse channelizer circuit for inverse channelizing the transmitted plurality of channelized waveforms to generate a digital signal and a digital-to-analog converter (DAC) for converting the digital signal to an analog signal.

8. The apparatus of claim 6, wherein one or more of said meta data generator circuit, said meta data interpreter circuit, said DDS, and said channel selector circuit are implemented in one or more field programmable gate arrays (FPGAs).

9. The apparatus of claim 6, wherein said meta data interpreter circuit further comprises:
  a frequency divider for dividing the frequency list by the number of communication channels to generate a quotient to be provided to the channel selector and a remainder to be provided to said DDS; and
  a phase selector for selecting a single phase for all the communication channels to be provided to said DDS.

10. A method for generating parallelized hardware-independent waveforms, the method comprising:
  generating metadata associated with a waveform, the metadata including a frequency list, a phase list and amplitude information for the waveform, wherein the metadata is generated independent of a number of parallel waveform paths;
  interpreting the metadata to generate frequency and amplitude parameters for the waveform, and a plurality of different phase parameters, each for a respective one of said parallel waveform paths;
  providing the frequency and amplitude parameters to a plurality of direct digital synthesizers (DDSs);
  providing said each of the plurality of different phase parameters to a respective DSS for generating a plurality of digital signals; and
  transmitting the plurality of digital signals over a plurality of communication channels.

11. The method of claim 10, further comprising multiplexing the transmitted plurality of digital signals to generate a digital signal and converting the digital signal to an analog signal.

12. The method of claim 10, wherein said interpreting the metal data further comprises:
  dividing the frequency list by the number of parallel waveform paths;
  providing the divided frequency list to each of the plurality of DSSs; and
  generating the plurality of different phase parameters (POA) according to:
  POA for DDS(M−1)=(M−1)*(Fout/Fs), where M is an integer number of parallel waveform paths, Fs is a clock frequency of the parallel waveform paths, and Fout is the divided frequency list for each of the plurality of DSSs.

13. The method of claim 10, further comprising:
  generating metadata associated with a plurality of different waveforms;
  multiplexing the metadata for each of the plurality of different waveforms; and
  generating a plurality of different digital signals to be transmitted over said plurality of parallel waveform paths.

14. An apparatus for generating parallelized hardware-independent waveforms comprising:
  a meta data generator circuit for generating metadata associated with a waveform, the metadata including a frequency list, a phase list and amplitude information for the waveform, wherein the metadata is generated independent of a number of parallel waveform paths;
  a meta data interpreter circuit for interpreting the metadata to generate frequency and amplitude parameters for the waveform, and a plurality of different phase parameters, each for a respective one of said parallel waveform paths;
  a plurality of direct digital synthesizers (DDSs) for inputting the frequency and amplitude parameters; and
  a phase selector for providing each of the plurality of different phase parameters to a respective one of said plurality of DSS for generating a plurality of digital signals to be transmitted over a plurality of communication channels.

15. The apparatus of claim 14, further comprising a multiplexor for multiplexing transmitted plurality of digital signals to generate a digital signal and a digital-to-analog converter (DAC) for converting the digital signal to an analog signal.

16. The apparatus of claim 15, wherein one or more of said meta data generator circuit, said meta data interpreter circuit, said plurality of DDSs, and said phase selector are implemented in one or more field programmable gate arrays (FPGAs).

* * * * *